(12) United States Patent
Tregub et al.

(10) Patent No.: US 9,640,772 B2
(45) Date of Patent: May 2, 2017

(54) ESTER-BASED SOLVENT SYSTEMS FOR PRINTABLE ORGANIC LIGHT-EMITTING DIODE INK FORMULATIONS

(71) Applicant: Kateeva, Inc., Menlo Park, CA (US)

(72) Inventors: Inna Tregub, San Jose, CA (US); Tane Boghozian, Sunnyvale, CA (US); Michelle Chan, San Francisco, CA (US)

(73) Assignee: Kateeva, Inc., Newark, CA (US)

( * ) Notice: Subject to any disclaimer, the term of this patent is extended or adjusted under 35 U.S.C. 154(b) by 497 days.

(21) Appl. No.: 14/012,315

(22) Filed: Aug. 28, 2013

(65) Prior Publication Data

US 2015/0044802 A1    Feb. 12, 2015

Related U.S. Application Data

(60) Provisional application No. 61/865,087, filed on Aug. 12, 2013.

(51) Int. Cl.
| | | |
|---|---|---|
| *H01L 51/50* | (2006.01) | |
| *H01L 51/00* | (2006.01) | |
| *C09D 11/36* | (2014.01) | |
| *C09D 11/50* | (2014.01) | |

(52) U.S. Cl.
CPC .......... *H01L 51/5012* (2013.01); *C09D 11/36* (2013.01); *C09D 11/50* (2013.01); *H01L 51/0005* (2013.01); *H01L 51/5056* (2013.01)

(58) Field of Classification Search
None
See application file for complete search history.

(56) References Cited

U.S. PATENT DOCUMENTS

| | | |
|---|---|---|
| 6,787,063 B2 | 9/2004 | Endo et al. |
| 6,878,974 B2 | 4/2005 | Heeger et al. |
| 7,911,134 B2 | 3/2011 | Prakash et al. |
| 8,187,669 B2 | 5/2012 | Kanbe et al. |
| 8,231,932 B2 | 7/2012 | Kanbe et al. |
| 8,404,159 B2 | 3/2013 | Goddard et al. |
| 2003/0107633 A1 | 6/2003 | Sato et al. |
| 2006/0145163 A1 | 7/2006 | Tsujimura et al. |
| 2007/0131949 A1 | 6/2007 | Liu |
| 2009/0026931 A1 | 1/2009 | Xu et al. |
| 2010/0051869 A1 | 3/2010 | Chichak et al. |
| 2011/0008590 A1 | 1/2011 | Goddard et al. |
| 2011/0073853 A1 | 3/2011 | Smith |
| 2011/0108824 A1 | 5/2011 | Heun et al. |
| 2011/0177304 A1 | 7/2011 | Rokuhara |
| 2011/0235327 A1 | 9/2011 | Sasaki |
| 2011/0240933 A1 | 10/2011 | Jung et al. |
| 2011/0315976 A1 | 12/2011 | Suh et al. |
| 2012/0211729 A1* | 8/2012 | Yamauchi .............. C09K 11/06 257/40 |
| 2012/0326139 A1 | 12/2012 | Chen |
| 2013/0026415 A1 | 1/2013 | James et al. |
| 2013/0026421 A1 | 1/2013 | James et al. |
| 2013/0062581 A1 | 3/2013 | May et al. |
| 2013/0069020 A1 | 3/2013 | May et al. |

FOREIGN PATENT DOCUMENTS

| | | |
|---|---|---|
| CN | 102916097 | 2/2012 |
| JP | 2001342364 | 12/2001 |
| JP | 2009287000 | 12/2009 |
| JP | 2011148236 | 8/2011 |
| TW | 20040172 A | 10/2004 |
| TW | 2010008374 A1 | 2/2010 |
| WO | WO 2005/076386 | 8/2005 |
| WO | WO 2006/123813 | 11/2006 |
| WO | 20111417515 | 11/2011 |
| WO | WO2013040468 | * 3/2013 |

OTHER PUBLICATIONS

International Search Report and Written Opinion issued on Jan. 10, 2014 for PCT Application No. PCT/US13/57074.
Examination Report issued on Oct. 21, 2016, to TW Patent Application 102131639.
Office Action mailed on Jan. 5, 2017, to JP Patent Application No. 2016-533288.
Office action issued on Oct. 18, 2016, to CN Patent Application No. 201380078849.4.

* cited by examiner

*Primary Examiner* — Nathan T Leong

(57) ABSTRACT

Ink compositions for forming active layers in an organic light-emitting diode are provided. Also provided are methods of forming active layers of an OLED using the ink compositions. The ink compositions comprise a solvent system in which a substantial majority of the solvent is comprised of one or more ester compounds.

27 Claims, 7 Drawing Sheets

ESTER-BASED SOLVENT SYSTEMS FOR PRINTABLE ORGANIC LIGHT-EMITTING DIODE INK FORMULATIONS

CROSS-REFERENCE TO RELATED APPLICATION

This application claims the benefit of U.S. Provisional Application No. 61/865,087, filed Aug. 12, 2013, which is incorporated herein in its entity.

SUMMARY

Ink compositions for forming active layers in an OLED are provided. Also provided are methods of forming active layers of an OLED using the ink compositions. Hole transport layers and light-emitting layers are examples of the types of active layers that can be formed using the present ink compositions. A substantially majority of the solvent in the ester-based solvent system comprises ester solvents, such as alkyl octanoates, alkyl sebacates or combinations of such esters with other ester solvents.

One embodiment of a method of forming a light-emitting layer for an organic light-emitting diode comprises the steps of: (a) forming a layer of an ink composition in an organic light-emitting pixel cell, the pixel cell comprising an emission region defined by a pixel bank, the ink composition comprising an organic electroluminescent material dissolved in an ester-based solvent system comprising at least one ester, the ester-based solvent system having a boiling point of at least 300° C. and a surface tension at 23° C. in the range from about 26 dyne/cm to about 33 dyne/cm; and (b) allowing the solvent from the solvent system to evaporate, whereby the light-emitting layer is formed. In some embodiments, the ester-based solvent system for a light-emitting layer comprises, consists of, or consists essentially of diethyl sebacate. In other embodiments, the ester-based solvent system for a light-emitting layer comprises, consists of, or consists essentially of octyl octanoate. In still other embodiments, the ester-based solvent system for a light-emitting layer comprises, consists of, or consists essentially of a mixture of octyl octanoate with at least one of dially phthalate and isononyl isononate.

One embodiment of a method of forming a hole transporting layer for an organic light-emitting diode comprises the steps of: (a) forming a layer of an ink composition in a pixel cell, the pixel cell comprising an emission region defined by a pixel bank, the ink composition comprising an hole transporting material comprising a crosslinking polymer, wherein the hole transporting material is dissolved in an ester-based solvent system comprising at least one ester, the ester-based solvent system having a boiling point of at least 300° C. and a surface tension at 23° C. in the range from about 25 dyne/cm to about 32 dyne/cm; and (b) allowing the solvent from the solvent system to evaporate, whereby the hole transporting layer is formed. In some embodiments, the ester-based solvent system for the hole transporting layer ink composition comprises an alkyl octanoate. This includes embodiment in which the ester-based solvent system comprises, consists of, or consists essentially of a mixture of diethyl octanoate and octyl octanoate.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
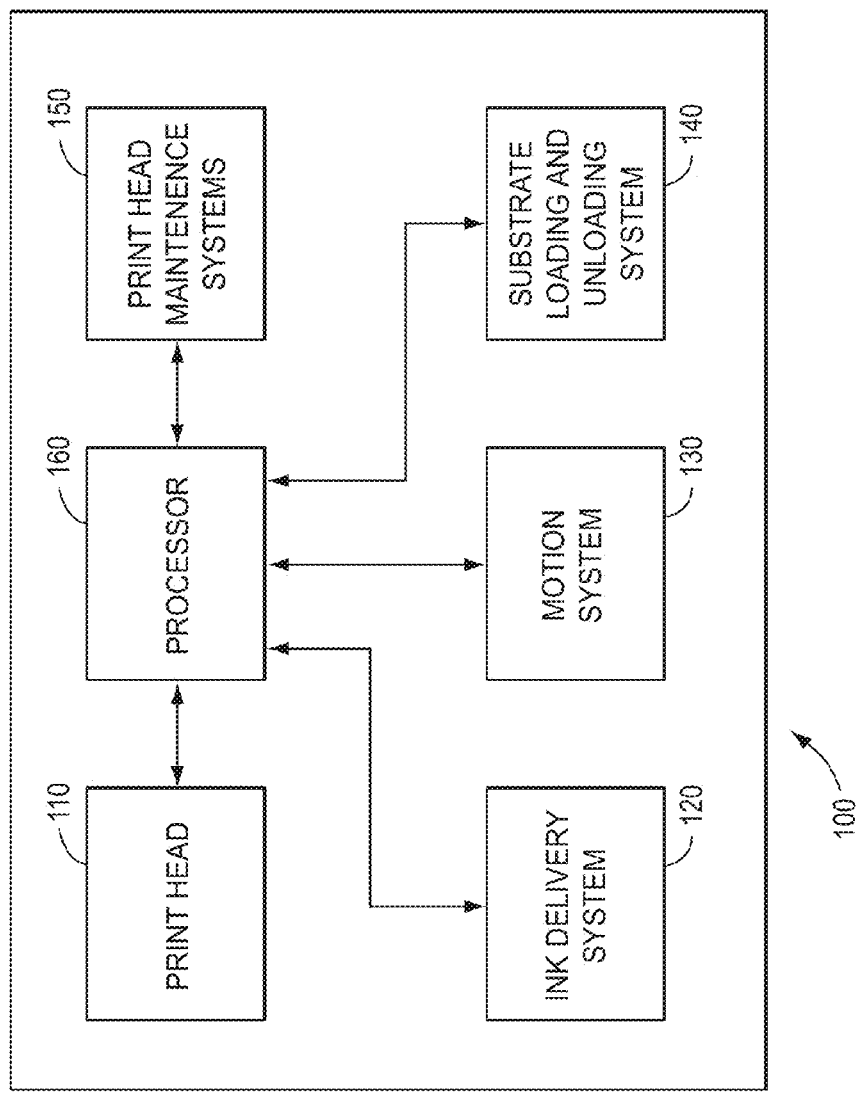
FIG. 1 is a block diagram that illustrates an organic light-emitting diode (OLED) inkjet printing system.

Ink compositions for forming active layers in an OLED are provided. Also provided are methods of forming active layers of an OLED using the ink compositions. The ink compositions are able to provide layers having highly uniform thicknesses and homogenous compositions. As a result, OLEDs fabricated using the ink compositions are able to provide highly uniform light emission profiles.

The ink compositions comprise a solvent system in which a substantial majority of the solvent is comprised of one or more ester compounds, referred to herein as ester-based solvent systems. For example, the ester-based solvent systems may comprise at least 90 weight percent (wt. %) ester solvents based on the total weight of the solvents in the system. This includes embodiments in which the ester-based solvent systems comprise at least 99 wt. % ester solvents and further includes embodiments in which the ester-based solvent systems consist essentially of, or consist of, ester solvents. Alkyl sebacates, such as di-n-alkyl sebacates, alkyl octanoates and mixtures of these with other esters are examples of esters that that are well suited for use in the ester-based solvent systems.

The solvent systems solubilize the functional organic polymers and/or compounds of an active layer in an OLED. The nature of these functional materials will depend on the nature of the layer being formed. For example, in ink compositions useful for forming a light-emitting layer, organic electroluminescent materials will be dissolved in the ester-based solvent system. Similarly, in ink compositions useful for forming a hole transporting layer, hole transporting materials will be dissolved in the ester-based solvent system. The ester-based solvent system may be used, for example, in place of more conventional solvents, such as dodecyl benzene, that are presently used in printable ink formulations for OLEDs.

The ink compositions can be deposited using a variety of film-forming techniques, including spin-coating, casting, thermal printing and inkjet printing. Therefore, the workable properties of the ink compositions will depend on the intended film-forming technique. Generally, for ink compositions useful for inkjet printing applications, the surface tension, viscosity and wetting properties of the ink compositions should be tailored to allow the compositions to be dispensed through an inkjet printing nozzle without drying onto or clogging the nozzle at the temperature used for printing (e.g., room temperature; ~23° C.). More specifically, it has been discovered that the ester-based solvent systems having a boiling point of at least about 300° C. (for example, a boiling point in the range from about 300° C. to about 330° C.) and a surface tension at 23° C. in the range from about 25 dyne/cm to about 33 dyne/cm are able to provide inkjet printed layers having highly uniform thicknesses and compositional homogeneity across the width of the layer. (For the purposes of this disclosure, the recited boiling points refer to boiling points at atmospheric pressure, unless otherwise indicated.)

Inkjet printers suitable for printing the present ink compositions are commercially available and can include drop-on-demand printheads, available from, for example, Fujifilm Dimatix (Lebanon, N.H.), Trident International (Brookfield, Conn.), Epson (Torrance, Calif.), Hitachi Data systems Corporation (Santa Clara, Calif.), Xaar PLC (Cambridge, United Kingdom), and Idanit Technologies, Limited (Rishon Le Zion, Isreal). For example, the Dimatix Materials Printer DMP-3000 may be used.

Light-emitting layers (EMLs) and hole transporting layers (HTLs) are examples of the types of active OLED layers that can be printed using the present ink compositions. For example, ink compositions for an HTL comprise an a hole transporting material, typically a semi-conducting, cross-linkable polymer, dissolved in an ester-based solvent system having a boiling point of at least 300° C. and a surface tension at 23° C. in the range from about 25 dyne/cm to about 32 dyne/cm. Some embodiments of the ester-based solvent systems for HTL ink compositions comprise, consist essentially of, or consist of one or more alkyl octanoates, such as octyl octanoate, diethyl octanoate or a mixture of thereof. A specific embodiment of one such ink composition comprises a mixture of diethyl octanoate and octyl octanoate in a weight ratio in the range from about 40:60 to about 60:40. This includes embodiments in which the weight ratio is in the range from about 45:55 to about 55:45 and further includes embodiments in which the weight ratio is about 50:50.

Examples of the polymers that may be included in the HTL ink compositions include polyvinyl carbazoles or derivatives thereof, polysilanes or derivatives thereof, polysiloxane derivatives having an aromatic amine at the side chain or the main chain, pyrazoline derivatives, arylamine derivatives, stilbene derivatives, triphenyldiamine derivatives, polyaniline or derivatives thereof, polythiophene or derivatives thereof, polyarylamines or derivatives thereof, polypyrroles or derivatives thereof, poly(p-phenylenevinylene) or derivatives thereof, or poly(2,5 thienylene vinylene) or derivatives thereof.

The concentration of hole transporting material in the HTL ink composition should be selected to render the ink composition suitable for the film-forming technique with which it will be applied. By way of illustration only, for an HTL ink composition useful in inkjet printing applications, the concentration of hole transporting material may be in the range from about 0.1 to about 5 wt. % (e.g., from about 0.5 to about 2 wt. %) based on the combined weight of the hole transporting material and the ester-based solvent system. Desirably, the hole transporting materials are sufficiently soluble in the solvents of the solvent system to provide an ink composition having a viscosity of 100 cPs or lower (e.g., 50 cPs or lower) at a hole transporting material concentration in the ink composition of up to 3 wt. %, or even higher, at the printing temperature.

Ink compositions for an EML comprise a light-emitting material dissolved in an ester-based solvent system having a boiling point of at least 300° C. and a surface tension at 23° C. in the range from about 26 dyne/cm to about 33 dyne/cm. Some embodiments of the ester-based solvent systems for EML ink compositions comprise, consist essentially of, or consist of an alkyl sebacate, such as diethyl sebacate, an alkyl octanoate, such as octyl octanoate, or a mixture comprising one or more alkyl sebacates or alkyl octanoates with another ester solvent, such as a phthalate. It has been discovered that alkyl sebacates, such as diethyl sebacate, are particularly useful in the ester-based solvent systems for EML inks because their wetting behavior, as measured by contact angle, is independent of, or substantially independent of the degree of crosslinking in an underlying HTL comprising a crosslinkable hole transporting polymer material. This is important because it allows ink compositions comprising diethyl sebacate to form EMLs having highly uniform and reproducible layer thicknesses on HTL substrates, even when the crosslinking in those HTLs is incomplete or differs from substrate to substrate.

A specific embodiment of one such ink composition comprises a mixture of octyl octanoate with diallyl phthalate. The octyl octanoate and dially phthalate may be present, for example, in a weight ratio in the range from about 60:40 to about 80:20. This includes embodiments in which the weight ratio is in the range from about 65:35 to about 75:25 and further includes embodiments in which the weight ratio is about 70:30.

Another embodiment of an EML ink composition comprises a mixture of octyl octanoate, diallyl phthalate and isononyl isononate. The weight ratio of the octyl octanoate to the combined weight of the diallyl phthalate and isononyl isononate in this ink composition may be in the range from about 50:50 to about 60:40, for example. The weight ratio of the dially phthalate to isononyl isononate in this composition may be in the range from about 60:40 to about 70:30, for example. By way of illustration only, one such EML ink composition comprises a mixture of octyl octanoate, diallyl phthalate and isononyl isononate in a weight ratio of about 55:30:15.

The light-emitting materials of the EML ink compositions generally comprise an organic polymer, small molecule or dendrimer that is itself a light-emitting material or that provides a light-emitting material in combination with one or more additional dopants, including metal complex dopants. For example, in some embodiments, the light-emitting materials comprise a polymeric host matrix and one or more dopants dispersed within the host matrix. Examples of organic polymer host materials that may be included in the EML ink composition include polyparaphenylene vinylene derivatives, polythiophene derivatives, polyparaphenylene derivatives, polysilane derivatives, polyacetylene derivatives, polyfluorene derivatives, and polyvinyl carbazole derivatives. In other embodiments, the host matrix material may be a small molecule. Metal complexes of 8-hydroxyquinoline and similar derivatives constitute one class of useful host materials and are particularly suitable for light emission at wavelengths longer than 500 nm Benzazole derivatives constitute another class of useful host materials and are particularly useful for light emission wavelengths above 400 nm. The host material can also include an anthracene derivative having substitutions in the 9 and 10 positions, for example derivatives of 9,10-diarylanthracenes.

Examples of the dopant materials that may be included in the ink compositions include perylene derivatives, coumarin derivatives, rubrene derivatives, quinacridone derivatives, squarylium derivatives, porphyrin derivatives, styryl pigments, tetracene derivatives, pyrazolone derivatives, decacyclene, and phenoxazon, cyclopendamine derivatives, tetraphenyl butadiene derivative compounds, triphenyl amine derivatives, oxadiazole derivatives, pyrazoloquinoline derivatives, distyrylbenzene derivatives, distyrylarylene derivatives, pyrrole derivatives, thiophene ring compounds, pyridine ring compounds, perynone derivatives, oligothiophene derivatives, oxa-diazole dimers, pyrazoline dimers, quinacridone derivatives, and coumarin derivatives. Examples of metal complex dopants that may be included in the EML ink compositions include metal complexes having as a central metal, Al, Zn, Be, a rare-earth metal such as Tb, Eu, and Dy, or the like and having as a ligand, a structure of oxadiazole, thiadiazole, phenylpyridine, phenylbenzimidazole, quinoline, or the like, for example, metal complexes such as iridium complexes and platinum complexes that emit light from the triplet excited state, benzoquinolinole beryllium complexes, benzoxazolyl zinc complexes, benzothiazole zinc complexes, azomethyl zinc complexes, porphyrin zinc complexes, and europium complexes.

The concentration of light-emitting material in the EML ink composition should be selected to render the ink composition suitable for the film-forming technique with which it will be applied. By way of illustration only, for an EML ink composition useful in inkjet printing applications, the concentration of light-emitting material may be in the range from about 0.1 to about 5 wt. % (e.g., from about 0.5 to about 2 wt. %) based on the combined weight of the light-emitting material and the ester-based solvent system.

Methods for forming an active layer of an OLED using the present ink compositions comprise the steps of forming a layer of the ink composition on a substrate using, for example, an OLED inkjet printing system, and allowing the solvents of the ester-based solvent system to evaporate. The step of allowing the solvents of the ester-based solvent system to evaporate may be facilitated by subjecting the layer of the ink composition to reduced pressure, that is—exposing it to a vacuum, by exposing the layer of the ink composition to elevated temperatures, or a combination of the two. Optionally, the layer subsequently may be baked in order to further remove solvent from the layer and/or to facilitate the crosslinking of any crosslinkable polymers in the ink formulation. Thus, a baking step may be used after the initial formation and an HTL comprising a crosslinkable polymer in order to crosslink said polymer, rendering it insoluble in the solvent system of a subsequently deposited layer.

Various embodiments of an OLED inkjet printing system can be comprised of several devices and apparatuses, which allow the reliable placement of drop of an ink composition onto specific locations on a substrate. These devices and apparatuses can include, but are not limited to, a printhead, ink delivery system, motion system, substrate loading and unloading system, and printhead maintenance system. A printhead includes at least one inkjet head, with at least one orifice capable of ejecting drops of the ink composition at a controlled rate, velocity, and size. The printhead can be fed by an ink composition supply system that provides the ink composition to the printhead. Printing requires relative motion between the printhead and the substrate. This can be accomplished with a motion system, typically a gantry or split axis XYZ system. Either the printhead can move over a stationary substrate (gantry style), or both the printhead and substrate can move, in the case of a split axis configuration. In another embodiment, the print station can be fixed, and the substrate can move in the X and Y axes relative to the printheads, with Z axis motion provided either at the substrate or the printhead. As the printheads move relative to the substrate, drops of ink composition are ejected at the correct time to be deposited in the desired location on the substrate. The substrate can be inserted and removed from the printer using a substrate loading and unloading system. Depending on the printer configuration, this can be accomplished with a mechanical conveyor, a substrate floatation table, or a robot with end effector.

A printhead maintenance system can be comprised of several subsystems that allow for such maintenance tasks, such as, but not limited by, drop volume measurement, elimination of excess ink from a printhead nozzle plate surface, and priming for ejecting ink into a waste basin.

FIG. 1 is a block diagram that illustrates an OLED inkjet printing system 100 that can be used to print the present ink compositions. System 100 includes printhead device 110, ink delivery system 120, motion system 130, substrate loading and unloading system 140, printhead maintenance system 150, processor 160, drop measurement device 170, and nozzle tuning device 180. Printhead device 110 includes at least one inkjet head, with at least one orifice capable of ejecting drops of an ink composition at a controlled velocity, and size. The inkjet head is fed by an ink supply system that provides the ink composition to the inkjet head. In various embodiments, the inkjet or printhead includes multiple orifices or nozzles that allow ink to be dispensed at more than one location on the substrate or panel at the same time. For example, ink composition is supplied to printhead device 110 using ink delivery system 120. Printhead maintenance system 150 can include several subsystems that allow for such maintenance tasks as drop volume measurement, wiping of the inkjet nozzle surface, priming for ejecting an ink composition into a waste basin.

Processor 160 is used to control and send and/or receive data to and/or from printhead 110, ink delivery system 120, motion system 130, substrate loading and unloading system 140, and printhead maintenance system 150. Processor 160 can be a computer system, such as the computer system shown in FIG. 1, a microcontroller, an application specific integrated circuit (ASIC), a field programmable gate array (FPGA), or an electronic circuit capable of sending and receiving control and data information and capable of executing instructions. Processor 160 can be one electronic circuit or multiple electronic circuits distributed among printhead 110, ink delivery system 120, motion system 130, substrate loading and unloading system 140, and printhead maintenance system 150 that can communicate with each other, for example.

The final product of the printing, drying and optional baking process is a layer of material having a highly uniform thickness and composition. For example, layers having a thickness variation no greater than 10% across the entire width of the layer are possible. The thickness across the layer can be measured using metrology tools, such as a stylus contact profilometer or an interferometer microscope. Suitable interferometers for optical interferometry are commercially available from Zygo instrumentation.

The ink compositions can be used to print active layers directly in a multi-layered OLED architecture. A typical OLED comprises a support substrate, an anode, a cathode and a light-emitting layer disposed in between the anode and cathode. Other layers that may be present in the device, include a layer of conductive hole injection material (HIL) provided between the anode and the light-emitting layer to assist with the injection of holes from the anode to the light-emitting layer, the hole transporting layer provided between the HIL (if present) and the light-emitting layer to assist with the transport of holes to the light-emitting layer, and an electron transporting layer (ETL) disposed between the EML and the cathode. The substrate is generally a transparent glass or plastic substrate and at least one of the anode and cathode is generally transparent in order to facilitate the transmission of the light emitted from the EML.

The HIL layer can also be formed using an ink composition comprising an ester-based solvent system. Such ink formulations will further comprise HIL materials comprising a conducting organic or inorganic material, which is typically doped. Examples of such materials include phenylamines, starburst-type amines, phthalocyanines, polyaniline, and polythiophene derivatives.

In these multi-layered architectures, one or more layers may be formed using ink compositions comprising the present ester-based solvent systems, while other layers may be formed using other types of solvent systems. Moreover, one or more layers may be formed via inkjet printing, while other layers may be deposited using other film-forming techniques. Typically, the various layers will be formed within one or more pixel cells defined by their corresponding pixel banks. Each cell comprises a floor and a wall that defines the perimeter of the cell. The surfaces with a cell optionally may be coated with a surface-modifying coating, such as a surfactant in order to keep deposited ink composition droplets from flooding out of the cells. However, in some embodiments, such surfactants are absent, as they may quench the luminescence of the light-emitting layer.

Figure 2:
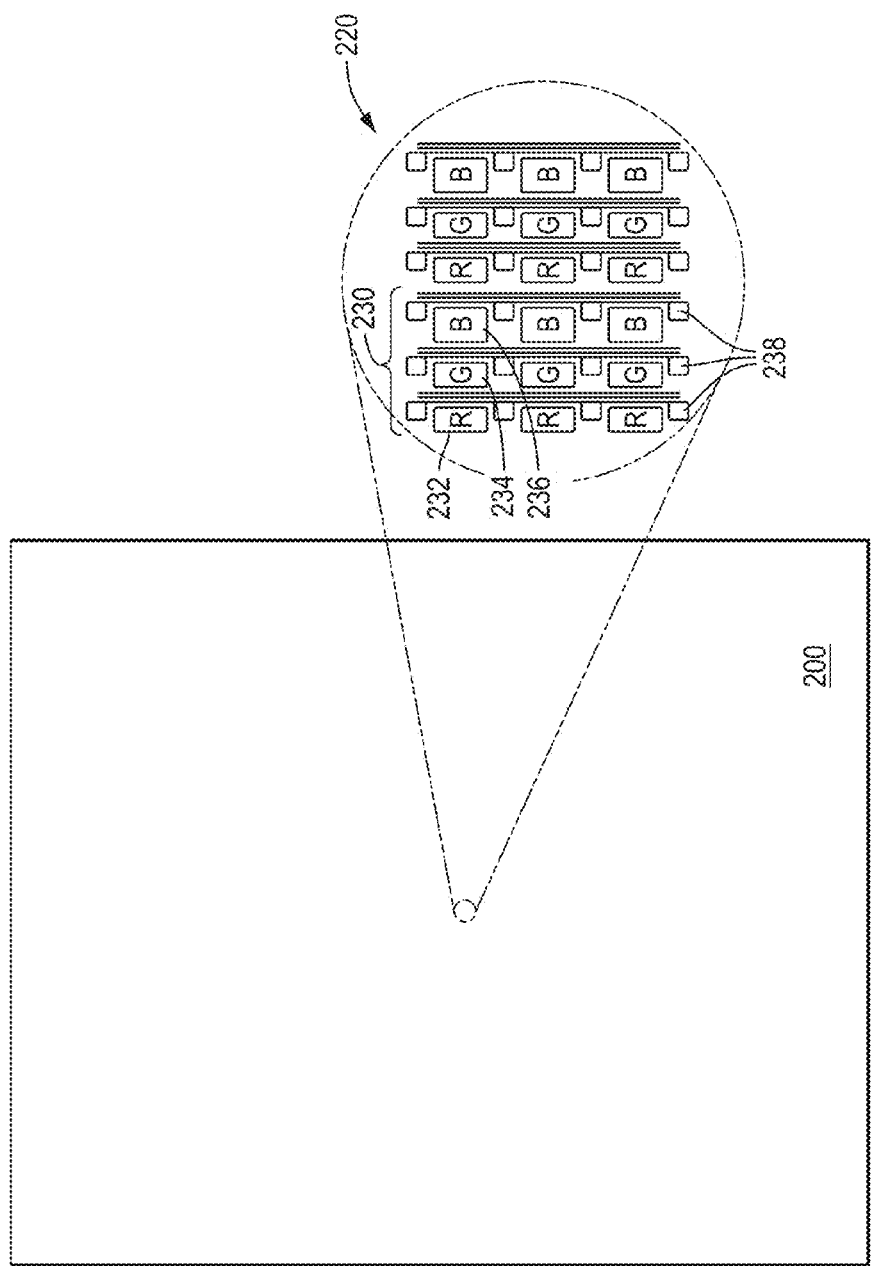
FIG. 2 is a schematic illustration of a flat panel display comprising a plurality of OLEDs arranged in a matrix of pixel cells, each pixel cell being defined by a pixel bank.

FIG. 2 is a schematic illustration of a flat panel display comprising a plurality of OLEDs arranged in a matrix of pixel cells defined by a matrix of pixel banks. FIG. 2 depicts an expanded view 220 of an area of panel 200, showing the arrangement 230 of a plurality of pixel cells, including a red light-emitting pixel cell 232, a green light-emitting pixel cell 234 and blue light-emitting pixel cell 236. Additionally, integrated circuitry 238 can be formed on a flat panel display substrate so that the circuitry is adjacent to each pixel cell for the purpose of applying voltage to each pixel in a controlled fashion during use. Pixel cell size, shape, and aspect ratios can vary depending on, for example, but not limited by, the resolution desired. For example, a pixel cell density of 100 ppi can be sufficient for a panel used for a computer display, where for high resolution of, for example of between about 300 ppi to about 450 ppi, can result in various pixel cell designs amenable to the effective packing of higher pixel density on a substrate surface.

EXAMPLE

The following example illustrates the use of ink compositions comprising ester-based solvent system to print an HTL and an EML in an OLED device architecture.

Materials and Methods.

Preparation of HTL Ink Composition:

A 30 ml amber vial and stir bar were cleaned and transferred to a glove box. A quantity of 0.12 g of hole transporting polymer powder was measured out in the inert environment of the glove box. An ester-based solvent system composed of 29.88 g of a mixture of distilled and degassed diethyl octanoate and octyl octanoate was prepared at a weight ratio of 1:1 in the vial. The prepared hole transporting solids were then added to the vial and mixed with the ester-based solvent system using the stir bar. The resulting mixture was stirred on a hot plate set at 60° C. until the solid powders were fully dissolved. The vial was then removed from the hot plate and allowed to cool to room temperature. The resulting solution was filtered through a 0.2 μm PTFE filter into an amber 100 mL glass bottle. A quantity of 2 mL of the solution was set aside for viscosity and surface tension measurements. Then the bottle was sealed, removed from the glove box and set aside for printing.

Preparation of EML Ink Composition:

30 ml amber vials and stir bars were cleaned and transferred to a glove box. A quantity of 0.3 g of organic electroluminescent material was measured out in the inert environment of the glove box. Quantities of 29.7 g of three different ester-based solvent systems were prepared in separate vials. The ester solvent of the first system was distilled and degassed diethyl sebacate; the ester solvent of the second system was octyl octanoate; and the ester solvents of the third system were a mixture of octyl octanoate, diallyl phthalate and isononyl isononate in a weight ratio of about 5.5:3:1.5. The prepared organic electroluminescent solids were added to the vials and mixed with the ester-based solvent systems using the stir bars. The resulting mixtures were stirred on a hot plate set at 150° C. until the solid powders were fully dissolved. The vials were then removed from the hot plate and allowed to cool to room temperature. The resulting solutions were filtered through a 0.2 μm PTFE filter into an amber 100 mL glass bottle. A quantity of 2 mL of each solution was set aside for viscosity and surface tension measurements. Then the bottles were sealed, removed from the glove box and set aside until for printing.

Viscosity and Surface Tension Measurements:

Viscosity measurements were carried out using a DV-I Prime Brookfield rheometer. Surface tension was measured with a SITA bubble pressure tensiometer.

Using these methods, the viscosity of the HTL ink composition was determined to be 3.71±0.1 cPs and its surface tension was determined to be 27.3±0.3 dyne/cm.

The viscosity of the EML ink composition comprising the first ester-based solvent system was determined to be 5.7±0.2 cPs and its surface tension was determined to be 31.5±0.1 dyne/cm. The viscosity of the EML ink composition comprising the second ester-based solvent system was determined to be 3.8±0.1 cPs and its surface tension was determined to be 27.5±0.1 dyne/cm. The viscosity of the EML ink composition comprising the third ester-based solvent system was determined to be 5.6±0.2 cPs and its surface tension was determined to be 29.1±0.1 dyne/cm.

OLED Fabrication and Printing:

In this example, the HTL and EML layers of the OLED are inkjet printed using ink compositions comprising ester-based solvent systems, as described above. The HIL device layer, a commercially available formulation, was also ink-jet printed. The other device layers are formed by other means, as described in greater detail below.

Figure 6A:
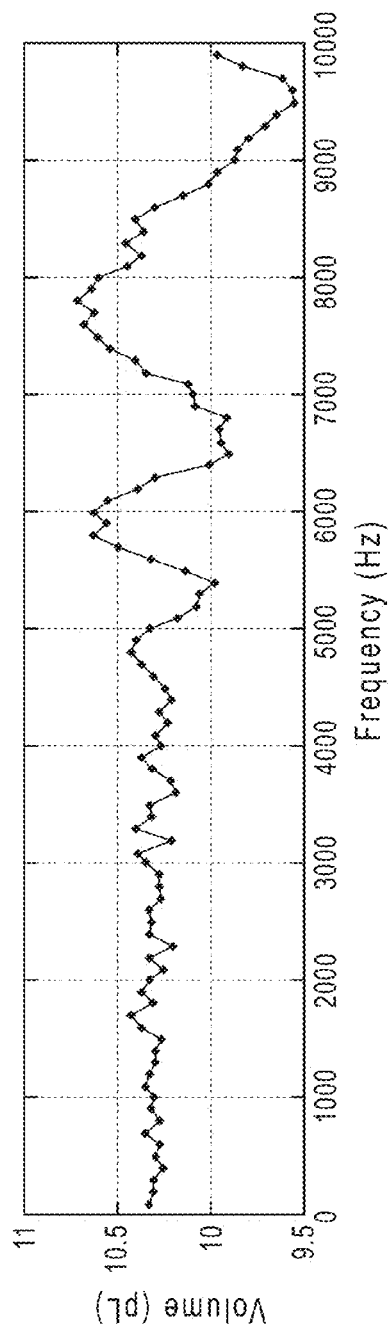
FIG. 6(A) is a graph showing the frequency response of the droplet volume for an EML ink composition comprising an ester-based solvent system of diethyl sebacate.
Figure 6B:
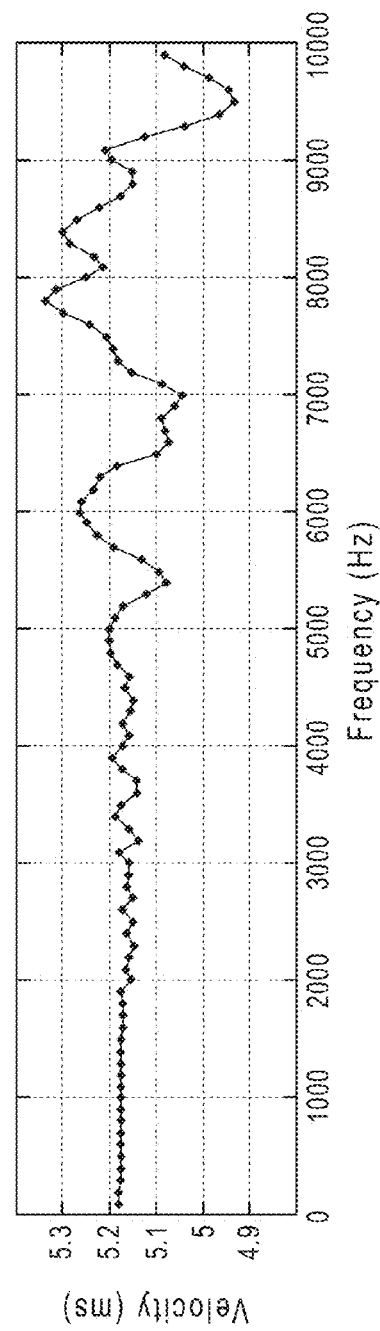
FIG. 6(B) is a graph showing the frequency response of the droplet velocity for an EML ink composition comprising an ester-based solvent system of diethyl sebacate.
Figure 7A:
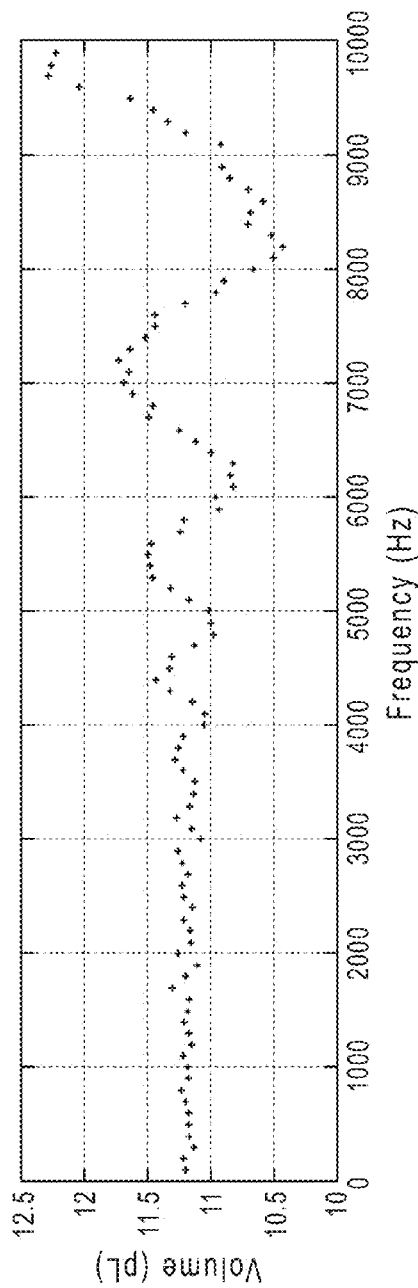
FIG. 7(A) is a graph showing the frequency response of the droplet volume for an HTL ink composition comprising an ester-based solvent system of ethyl octanoate and octyl octanoate.
Figure 7B:
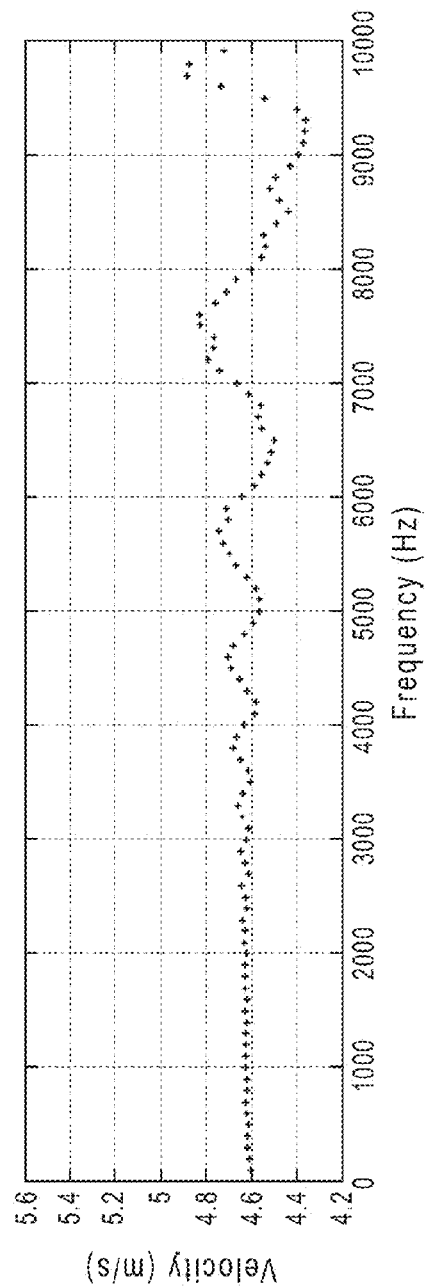
FIG. 7(B) is a graph showing the frequency response of the droplet velocity for an HTL ink composition comprising an ester-based solvent system of ethyl octanoate and octyl octanoate.

For the inkjet printed HTL and EML layers, the ink composition is loaded into the ink cartridge for use with an inkjet printer, such as a Dimatix Materials Printer DMP-3000, available from Fujifilm. The ink cartridge is then placed in the printer and the substrate positioned below the print head. A waveform for firing the ink is developed and the pulse times and voltages are adjusted and optimized to establish a stable jetting range. For example, ink jet tests can be conducted to assess the print performance of the ink compositions by examining the effects of changing the frequency on droplet volume and velocity. Examples of results from this type of frequency response test, after optimizing the pulse times and voltages, are illustrated in the graphs of FIGS. 6(A) and 6(B) which show the frequency response of droplet volume and velocity, respectively, for the EML ink composition comprising diethyl sebacate. FIGS. 7(A) and 7(B) show the frequency response of droplet volume and velocity, respectively, for the HTL ink composition comprised of the mixture of diethyl octanoate and octyl octanoate.

The substrate of the OLED is glass, with a thickness of 0.7 mm, on which an anode of 60 nm ITO (indium tin oxide) is patterned. A bank material (also known as a pixel definition layer) is then patterned over the ITO, forming a well into which the inkjet printed layers are deposited. An HIL layer composed of PEDOT:PSS (poly(3,4-ethylenedioxythiophene)poly(styrenesulfonate)) is then ink-jet printed into the well and dried under vacuum and baked at an elevated temperature in order to remove solvent from the layer. The HTL layer is then inkjet printed onto the HIL layer according to the process described above, followed by drying under vacuum and baking at an elevated temperature to remove solvent and induce the crosslinking in the crosslinkable polymer. Then the EML layer is inkjet printed onto the HTL layer according to the process described above, followed by drying under vacuum and baking at an elevated temperature to remove solvent. A cathode layer is then applied by vacuum thermal evaporation. An ETL layer followed by a cathode layer are then applied by vacuum thermal evaporation. The cathode layer is composed of 100 nm of aluminum.

Characterization.

Figure 3A:
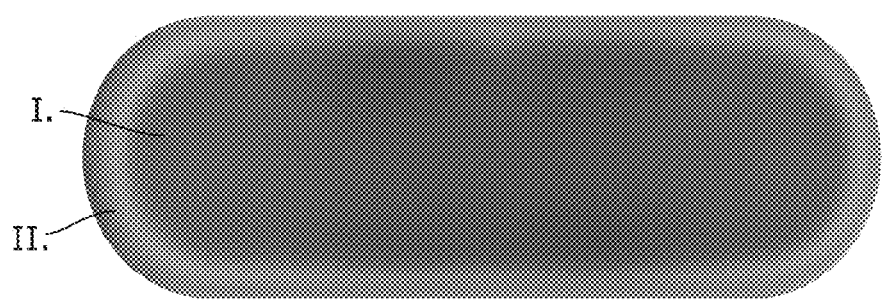
FIG. 3(A) shows a microphotograph of the luminescence emitted from an OLED having an EML printed with an ink composition comprising an ester-based solvent system of diethyl sebacate.
Figure 3B:
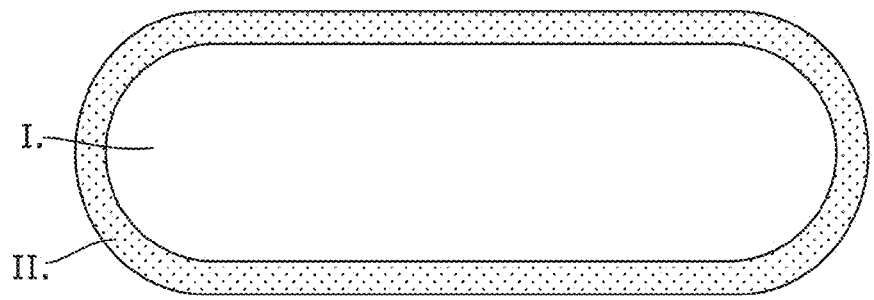
FIG. 3(B) is a black and white line drawing of the microphotograph in FIG. 3(A)
Figure 3C:
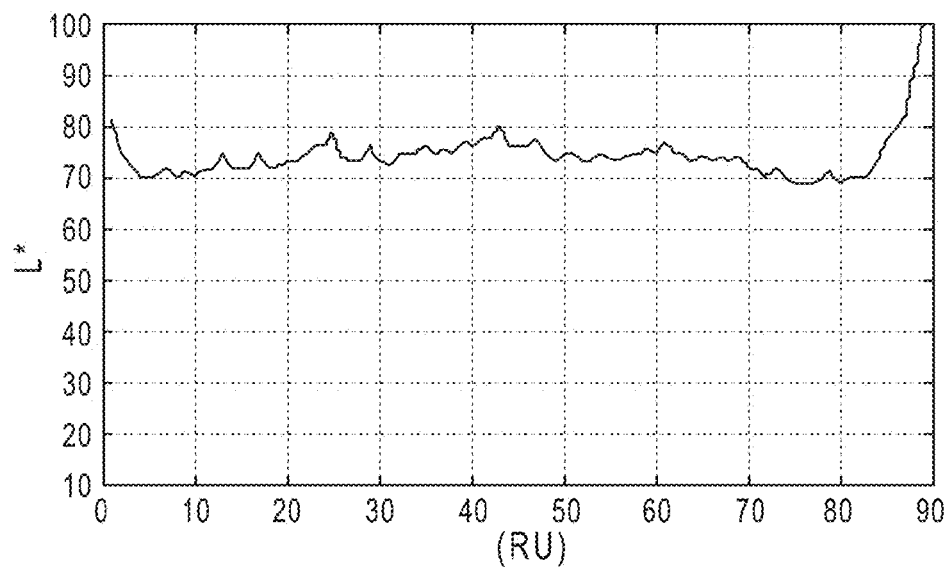
FIG. 3(C) shows the emission intensity distribution corresponding to the micrograph of FIG. 3(A).
Figure 4A:
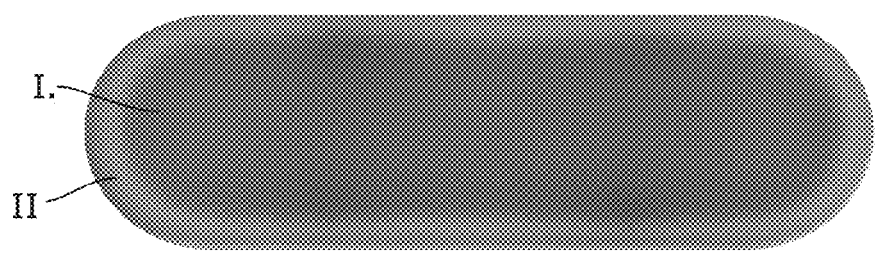
FIG. 4(A) shows a microphotograph of the luminescence emitted from an OLED having an EML printed with an ink composition comprising an ester-based solvent system of octyl octanoate.
Figure 4B:
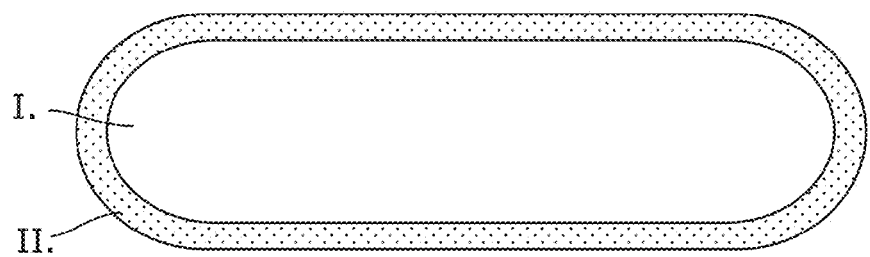
FIG. 4(B) is a black and white line drawing of the microphotograph in FIG. 4(A)
Figure 4C:
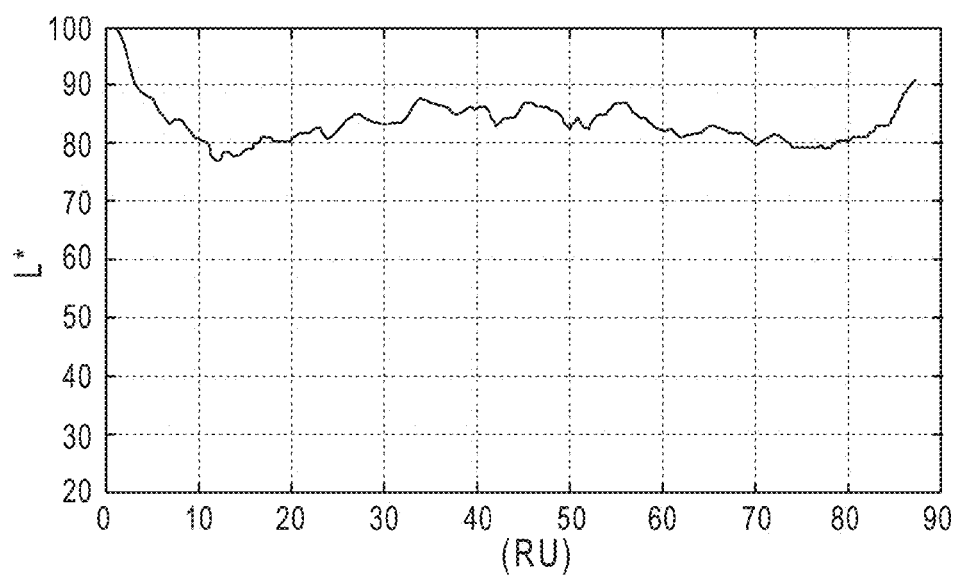
FIG. 4(C) shows the emission intensity distribution corresponding to the micrograph of FIG. 4(A).
Figure 5A:
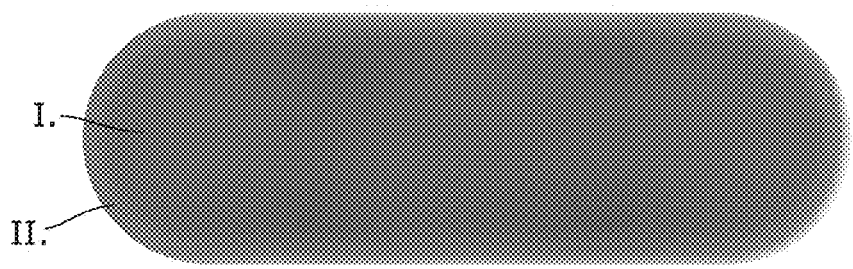
FIG. 5(A) shows a microphotograph of the luminescence emitted from an OLED having an EML printed with an ink composition comprising an ester-based solvent system of a mixture of octyl octanoate, dially phthalate and isononyl isononate.
Figure 5B:
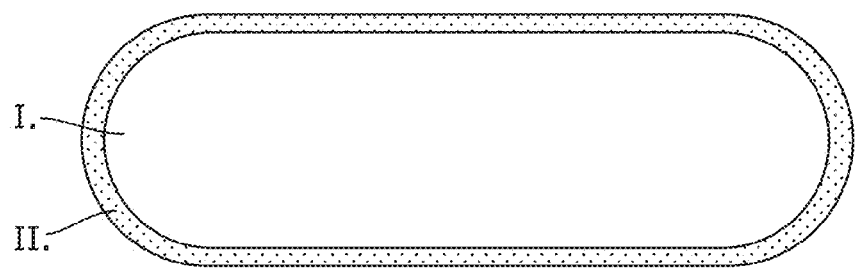
FIG. 5(B) is a black and white line drawing of the microphotograph in FIG. 5(A)
Figure 5C:
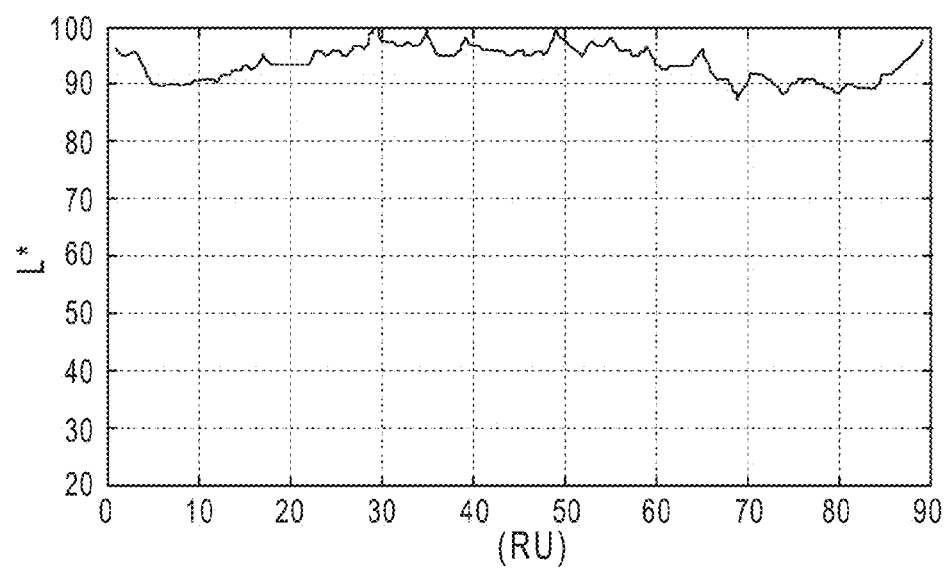
FIG. 5(C) shows the emission intensity distribution corresponding to the micrograph of FIG. 5(A).

Once the OLEDs were fabricated, the uniformity of their electroluminescence was investigated by applying an electrical current across each diode and imaging the light emission. The results of are shown in FIGS. 3-5. The panel (A) in each figure is a microphotograph showing an image of the luminescence of each OLED, panel (B) in each figure is a black and white line rendering of the microphotographs, and panel (C) in each figure is the corresponding electroluminescence intensity distribution across the width of each OLED. In FIGS. 3(C), 4(C) and 5(C) the data are normalized to the brightest point of luminescence across the length of the pixel. The emission from the OLED is represented by regions I and II in the B panels of FIGS. 3-5. The C panels of FIGS. 3-5 show the uniformity distribution of the OLED emission across the width of the pixel, including regions I and II. Typically, the emission is slightly higher in region II compared to region I. The pixel bank defines the active area of the OLED pixel and is located at the outer edge of region II.

The uniformity of the luminescence from a pixel can be quantified by the coefficient of variation in the luminescence (CV %), which is defined as its ((standard deviation)/mean) *100). In some embodiments, the present ester based solvent systems enable the fabrication of OLED pixels having a CV % of no greater than 20%. This includes embodiments of OLED pixels having a CV % of no greater than 16%, no greater than 12% and no greater than 10%. By way of illustration, some embodiments of the OLED pixels provide a CV % in the range from about 2 to about 20%. This includes embodiments that provide a CV % in the range from about 5 to about 15%.

By way of illustration, the CV % of the OLED pixels fabricated in accordance with this example were measured as follows. The luminescence emission was measured across a 2D region of interest (ROI), represented as region I in FIGS. 3(A), 3(B), 4(A), 4(B), 5(A) and 5(B), the standard deviation and mean for the emission from the ROI was then determined for each OLED and the CV % was calculated. The results of the calculations are provided in Table 1, below.

TABLE 1

| CV % for OLED Pixels | |
|---|---|
| Ester-Based Solvent System Used in EML Ink Composition | ((Standard Deviation/Mean) * 100) (CV % for Luminescence) |
| Diethyl Sebacate | 11.38 |
| Octyl Octanoate | 9.82 |
| Octyl Octanoate, Diallyl Phthalate and Isononyl Isononate Mixture | 15.79 |

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a light-emitting layer for an organic light-emitting diode, the method comprising:
   forming a layer of an ink composition in a pixel cell of a organic light-emitting diode pixel bank, the pixel cell comprising an emission region defined by a pixel bank, the ink composition comprising an organic electroluminescent material dissolved in an ester-based solvent system comprising at least one ester, the ester-based solvent system having a boiling point of at least 300° C. and a surface tension at 23° C. in the range from about 26 dyne/cm to about 33 dyne/cm; and allowing the solvent from the solvent system to evaporate, whereby the light-emitting layer is formed.

2. The method of claim 1, wherein the ester-based solvent system comprises an ester selected from alkyl octanoates, alkyl sebacates or combinations thereof.

3. The method of claim 1, wherein the ester-based solvent system comprises diethyl sebacate.

4. The method of claim 1, wherein the ester-based solvent system consists essentially of diethyl sebacate.

5. The method of claim 1, wherein the ester-based solvent system comprises an alkyl octanoate.

6. The method of claim 5, wherein the ester-based solvent system comprises octyl octanoate.

7. The method of claim 6, wherein the ester-based solvent system consists essentially of octyl octanoate.

8. The method of claim 6, wherein the ester-based solvent system comprises at least one additional ester, and further wherein the ester-based solvent system comprises at least 50 weight percent octyl octanoate, based on the total weight of the solvents in the ester-based solvent system.

9. The method of claim 8, wherein the at least one additional ester comprises diallyl phthalate, isononyl isononate or a mixture thereof.

10. The method of claim 1, wherein the thickness of the light-emitting layer varies by no more than 10% across the width of the pixel cell.

11. The method of claim 1, wherein the ester-based solvent system comprises at least 99 weight percent ester, based on the total weight of the solvents in the ester-based solvent system.

12. The method of claim 11, wherein the ester-based solvent system consists essentially of esters.

13. The method of claim 1, wherein the at least one ester has a boiling point of at least 300° C. and a surface tension at 23° C. in the range from about 26 dyne/cm to about 33 dyne/cm.

14. The method of claim 1, wherein the ester-based solvent system comprises at least 90 weight percent ester, based on the total weight of the solvents in the ester-based solvent system.

15. A method of forming a hole transporting layer for an organic light-emitting diode, the method comprising:
forming a layer of an ink composition in a pixel cell of a organic light-emitting diode pixel bank, the pixel cell comprising an emission region defined by a pixel bank, the ink composition comprising an hole transporting material comprising a crosslinking polymer, wherein the hole transporting material is dissolved in an ester-based solvent system comprising at least one ester, the ester-based solvent system having a boiling point of at least 300° C. and a surface tension at 23° C. in the range from about 25 dyne/cm to about 32 dyne/cm; and
allowing the solvent from the solvent system to evaporate, whereby the hole transporting layer is formed.

16. The method of claim 15, wherein the ester-based solvent system comprises an alkyl octanoate.

17. The method of claim 16, wherein the ester-based solvent system comprises two or more alkyl octanoates.

18. The method of claim 17, wherein the ester-based solvent system comprises diethyl octanoate and octyl octanoate.

19. The method of claim 18, wherein the ester-based solvent system consists essentially of diethyl octanoate and octyl octanoate.

20. The method of claim 15, wherein the thickness of the hole transporting layer varies by no more than 10% across the width of the pixel cell.

21. A method of forming a hole transport layer and a light-emitting layer for an organic light-emitting diode, the method comprising:
forming a layer of an ink composition in a pixel cell of a organic light-emitting diode pixel bank, the pixel cell comprising an emission region defined by a pixel bank, the ink composition comprising an hole transporting material comprising a crosslinking polymer, wherein the hole transporting material is dissolved in an ester-based solvent system comprising at least one ester, the ester-based solvent system having a boiling point of at least 300° C. and a surface tension at 23° C. in the range from about 25 dyne/cm to about 32 dyne/cm;
allowing the solvent from the solvent system to evaporate, whereby the hole transporting layer is formed;
forming a layer of an ink composition on the hole transporting layer, the ink composition comprising an organic electroluminescent material dissolved in an ester-based solvent system comprising at least one ester, the ester-based solvent system having a boiling point of at least 300° C. and a surface tension at 23° C. in the range from about 26 dyne/cm to about 33 dyne/cm; and
allowing the solvent from the solvent system to evaporate, whereby the light-emitting layer is formed.

22. The method of claim 21, wherein the crosslinking polymer of the hole transporting layer is not fully crosslinked.

23. A method of forming a hole transporting layer and a light-emitting layer for an organic light-emitting diode, the method comprising:
forming a layer of a first ink composition in a pixel cell of a organic light-emitting diode pixel bank, the first ink composition comprising a hole transporting material comprising a crosslinking polymer, wherein the hole transporting material is dissolved in a first ester-based solvent system comprising a mixture of diethyl octanoate and octyl octanoate;
allowing the solvent from the first ester-based solvent system to evaporate, whereby the hole transporting layer is formed;
forming a layer of a second ink composition in the pixel cell on the hole transporting layer, the second ink composition comprising an organic electroluminescent material dissolved in a second ester-based solvent system comprising diethyl sebacate; and
allowing the solvent from the second ester-based solvent system to evaporate, whereby the light-emitting layer is formed.

24. The method of claim 15, wherein the ester-based solvent system comprises at least 99 weight percent ester, based on the total weight of the solvents in the ester-based solvent system.

25. The method of claim 24, wherein the ester-based solvent system consists essentially of esters.

26. The method of claim 15, wherein the at least one ester has a boiling point of at least 300° C. and a surface tension at 23° C. in the range from about 25 dyne/cm to about 32 dyne/cm.

27. The method of claim 15, wherein
the ester-based solvent system comprises at least 90 weight percent ester, based on the total weight of the solvents in the ester-based solvent system.

* * * * *